(12) United States Patent
Chang et al.

(10) Patent No.: US 9,209,086 B2
(45) Date of Patent: Dec. 8, 2015

(54) LOW TEMPERATURE SALICIDE FOR REPLACEMENT GATE NANOWIRES

(71) Applicant: GLOBALFOUNDRIES Inc., Grand Cayman (KY)

(72) Inventors: Josephine B. Chang, Mahopac, NY (US); Michael A. Guillorn, Yorktown Heights, NY (US); Gen P. Lauer, Mahopac, NY (US); Isaac Lauer, Yorktown Heights, NY (US); Jeffrey W. Sleight, Ridgefield, CT (US)

( * ) Notice: Subject to any disclaimer, the term of this patent is extended or adjusted under 35 U.S.C. 154(b) by 40 days.

(21) Appl. No.: 13/947,316

(22) Filed: Jul. 22, 2013

(65) Prior Publication Data

US 2015/0021715 A1    Jan. 22, 2015

(51) Int. Cl.
| | |
|---|---|
| H01L 21/8234 | (2006.01) |
| H01L 29/66 | (2006.01) |
| H01L 29/78 | (2006.01) |
| H01L 21/84 | (2006.01) |
| H01L 29/06 | (2006.01) |
| B82Y 10/00 | (2011.01) |
| B82Y 40/00 | (2011.01) |
| H01L 29/775 | (2006.01) |

(52) U.S. Cl.
CPC ......... *H01L 21/823431* (2013.01); *B82Y 10/00* (2013.01); *B82Y 40/00* (2013.01); *H01L 21/845* (2013.01); *H01L 29/0665* (2013.01); *H01L 29/0669* (2013.01); *H01L 29/0673* (2013.01); *H01L 29/665* (2013.01); *H01L 29/66439* (2013.01); *H01L 29/66545* (2013.01); *H01L 29/66795* (2013.01); *H01L 29/775* (2013.01); *H01L 29/78* (2013.01); *H01L 29/785* (2013.01)

(58) Field of Classification Search
CPC ............... H01L 21/823821; H01L 21/823431; H01L 29/785–29/7856; H01L 29/66545; H01L 2029/7857–2029/7858; H01L 21/845; H01L 29/6681; H01L 29/66818; H01L 29/0665; H01L 29/0669; H01L 21/02603; H01L 26/665
See application file for complete search history.

(56) References Cited

U.S. PATENT DOCUMENTS

| | | | |
|---|---|---|---|
| 6,342,414 B1 | 1/2002 | Xiang et al. | |
| 7,553,763 B2 | 6/2009 | Hsiao et al. | |
| 7,923,337 B2 | 4/2011 | Chang et al. | |
| 8,217,423 B2 | 7/2012 | Liu et al. | |
| 8,278,701 B2 | 10/2012 | Terai | |

(Continued)

OTHER PUBLICATIONS

Chu et al., "Advances in Selective Etching for Nano Scale Salicide Fabrication," 2009 IEEE Nanotechnology Materials and Devices Conference, Jun. 2-5, 2009, Traverse City, Michigan, USA.

*Primary Examiner* — Jose R Diaz
(74) *Attorney, Agent, or Firm* — Michael J. Chang, LLC (57) ABSTRACT

Techniques for integrating low temperature salicide formation in a replacement gate device process flow are provided. In one aspect, a method of fabricating a FET device is provided that includes the following steps. A dummy gate(s) is formed over an active area of a wafer. A gap filler material is deposited around the dummy gate. The dummy gate is removed selective to the gap filler material, forming a trench in the gap filler material. A replacement gate is formed in the trench in the gap filler material. The replacement gate is recessed below a surface of the gap filler material. A gate cap is formed in the recess above the replacement gate. The gap filler material is etched back to expose at least a portion of the source and drain regions of the device. A salicide is formed on source and drain regions of the device.

11 Claims, 6 Drawing Sheets

(56) References Cited

U.S. PATENT DOCUMENTS

| | | |
|---|---|---|
| 8,338,247 B2 | 12/2012 | Yamaguchi et al. |
| 8,466,027 B2 * | 6/2013 | Chen et al. .................... 438/283 |
| 2008/0061284 A1 | 3/2008 | Chu et al. |
| 2010/0044799 A1 * | 2/2010 | Kurahashi et al. ............ 257/369 |
| 2010/0164008 A1 | 7/2010 | Mehrad et al. |
| 2010/0321044 A1 | 12/2010 | Sheu et al. |
| 2011/0316565 A1 | 12/2011 | Guo et al. |
| 2012/0139015 A1 | 6/2012 | Yu et al. |
| 2012/0273901 A1 * | 11/2012 | Yin et al. ...................... 257/410 |
| 2012/0329227 A1 | 12/2012 | Chang et al. |
| 2013/0015527 A1 | 1/2013 | Thees et al. |

* cited by examiner

FIG. 12 gapfill + planarization

FIG. 13 dummy gate removal

FIG. 14 wire release by SiGe etch

FIG. 15 gate stack + planarization

FIG. 16 metal recess etch

FIG. 17 gate cap formed by nitride deposition and planarization

FIG. 18
gap-fill de-layering

FIG. 19
salicide formation

US 9,209,086 B2

LOW TEMPERATURE SALICIDE FOR REPLACEMENT GATE NANOWIRES

FIELD OF THE INVENTION

The present invention relates to replacement gate fabrication processes and more particularly, to techniques for integrating low temperature salicide formation in a replacement gate device process flow.

BACKGROUND OF THE INVENTION

A gate-last CMOS fabrication process is often used for material availability and stress-induced performance enhancement reasons. Also called a replacement-gate process, the gate-last approach generally requires a high temperature anneal after the gate dielectric is deposited in order to improve reliability of the dielectric.

Thus every component of the device that is present prior to the anneal must be compatible with high processing temperatures. One aspect of the device design particularly impacted by this requirement is the silicidation process commonly employed to form source and drain contacts. In this regard, with conventional device fabrication techniques, the use of a replacement gate process forces the device design to either have a high temperature compatible salicide or to employ a non self-aligned trench silicide.

While a high temperature compatible material will permit the formation of a self-aligned silicide (a salicide), desirable metals such as nickel cannot be used. Alignment issues are prevalent with a trench silicide scheme, especially when dealing with scaled device dimensions.

Thus, improved salicide techniques that are compatible with a replacement gate process would be desirable.

SUMMARY OF THE INVENTION

The present invention provides techniques for integrating low temperature salicide formation in a replacement gate device process flow. In one aspect of the invention, a method of fabricating a field-effect transistor (FET) device is provided. The method includes the following steps. At least one dummy gate is formed over an active area of a wafer, wherein the dummy gate is formed over a portion of the active area which serves as a channel region of the device, and wherein portions of the active area extending out from under the dummy gate serve as source and drain regions of the device. Spacers are formed on opposite sides of the dummy gate. A gap filler material is deposited around the dummy gate. The dummy gate is removed selective to the gap filler material, forming a trench in the gap filler material. A replacement gate is formed in the trench in the gap filler material. The replacement gate is annealed at a temperature of from about 700° C. to about 1,300° C. The replacement gate is recessed below a surface of the gap filler material forming a recess in the gap filler material above the replacement gate. A gate cap is formed in the recess above the replacement gate. The gap filler material is etched back to expose at least a portion of the source and drain regions of the device. A salicide is formed on the source and drain regions of the device.

In another aspect of the invention, a FET device is provided. The FET device includes at least one gate over an active area of a wafer, wherein the gate is present over a portion of the active area which serves as a channel region of the device, and wherein portions of the active area extending out from under the gate serve as source and drain regions of the device; spacers on opposite sides of the gate; a gate cap on the gate, wherein the gate cap in combination with the spacers encapsulate the gate; a gap filler material around the gate, wherein the gap filler material is recessed such that at least a portion of the source and drain regions of the device is exposed; and a salicide on the exposed portion of source and drain regions of the device.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques that enable the use of a low temperature salicide in a replacement gate process flow. The term "low temperature salicide" as used herein refers to a self-aligned silicide (i.e., a salicide) that would be degraded by exposure to the high temperatures encountered with the replacement gate process during the final gate anneal. As will be described in detail below, the present process involves de-layering the gap-fill dielectric after the replacement gate formation, which permits the low temperature salicide to be formed after the replacement gate anneal.

An overview of the present techniques is first provided by way of reference to FIGS. 1-8, followed by an exemplary implementation in the context of a fin first, wire last, gate-all-around (GAA) device shown illustrated in FIGS. 9-19. The present techniques are generally applicable to any replacement gate device fabrication process, including but not limited to, FinFET, nanowire and planar device configurations. Thus the process as described herein generally begins with a wafer having an active area(s) in which the device(s) will be formed. For instance, in the example depicted in FIGS. 1-8, the active area includes one or more fins patterned in a semiconductor wafer. This is however merely an example.

A replacement gate flow involves patterning a dummy gate(s) early on in the process which will later be removed and replaced with a replacement gate(s). The example shown in FIG. 1 involves a fin field-effect transistor (finFET) device in which the fins are patterned prior to dummy gate formation (i.e., a fin first process). This is merely an example intended to illustrate the present techniques. Fin last-based processes (i.e., wherein the dummy gate is placed prior to fin formation) may be employed in the same manner as described herein. See, for example, U.S. Pat. No. 7,923,337 issued to Chang et al., entitled "Fin Field Effect Transistor Devices with Self-Aligned Source and Drain Regions," the contents of which are incorporated by reference herein.

Figure 1:
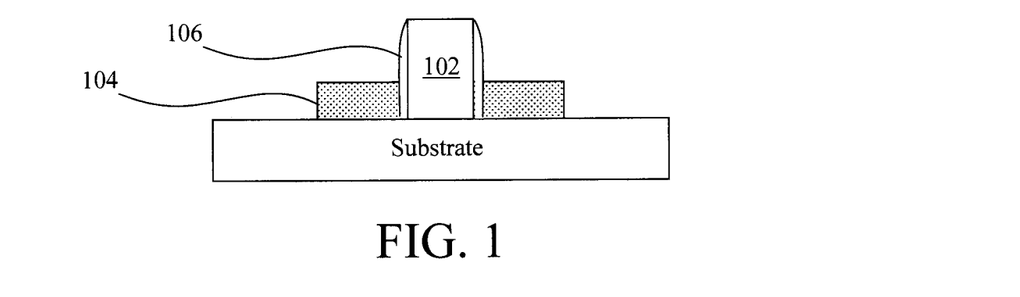
FIG. 1 is a cross-sectional diagram illustrating a dummy gate having been formed over an active area (patterned into a fin) according to an embodiment of the present invention.

Specifically, as shown in FIG. 1, a dummy gate 102 is formed over (semiconductor) fin(s) 104. To form the dummy gate 102, a suitable dummy gate material (e.g., poly-silicon) is deposited onto the substrate, over the fin 104, and then patterned using standard lithography and etching techniques to form dummy gate 102. Spacers 106 are then formed on opposite sides of the dummy gate 102. According to an exemplary embodiment, spacers 106 are formed from a nitride material, such as silicon nitride.

In this example, the dummy gate 102 covers a portion of the fin(s) 104 which will serve as a channel region of the device. Portions of the fin(s) 104 extending out laterally from the dummy gate 102 will serve as source and drain regions of the device.

Figure 2:
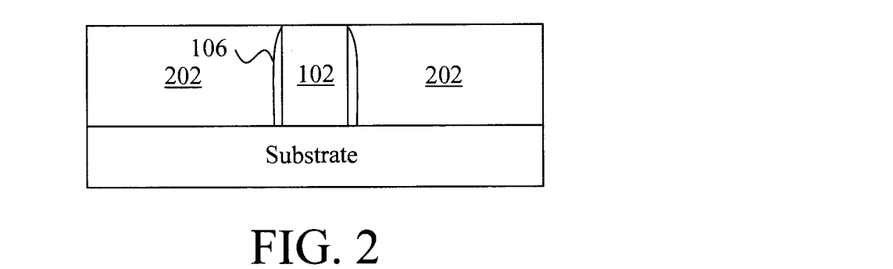
FIG. 2 is a cross-sectional diagram illustrating a filler material having been deposited around the dummy gate according to an embodiment of the present invention.
Figure 3:
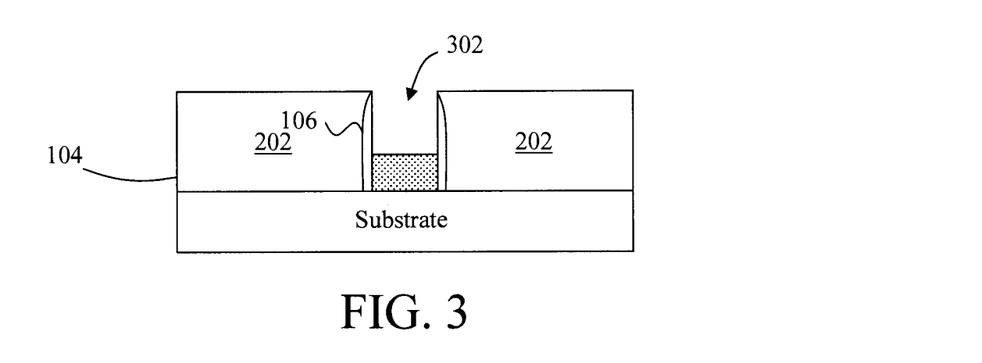
FIG. 3 is a cross-sectional diagram illustrating the dummy gate having been removed selective to the gap filler material, resulting in a trench having been formed in the gap filler material according to an embodiment of the present invention.
Figure 4:
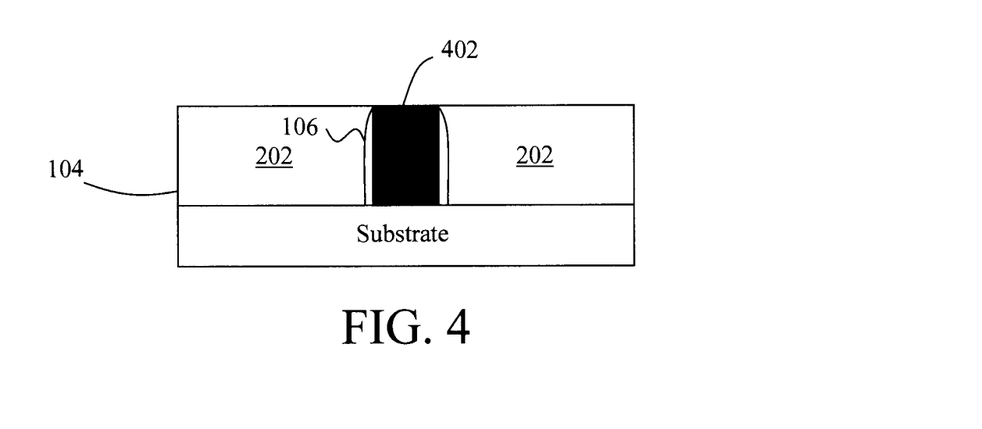
FIG. 4 is a cross-sectional diagram illustrating a replacement gate having been formed in the trench according to an embodiment of the present invention.

Next, as shown in FIG. 2, a filler material 202 is deposited onto the substrate, surrounding the dummy gate 104. Suitable gap filler materials include, but are not limited to a dielectric material, such as silicon dioxide ($SiO_2$). The dummy gate 102 is then removed selective to the gap filler material 202, resulting in a trench 302 having been formed in the gap filler material 202. See FIG. 3. As shown in FIG. 3, the channel region of the device is exposed in the trench 302.

A replacement gate 402 is next formed in the trench 302, over the channel region of the device. See FIG. 4. The replacement gate 402 can have one of variety of different configurations. By way of example only, the replacement gate can include doped polysilicon and/or one or more metals. A gate dielectric is often present between the gate 402 and the channel region. Formation of the replacement gate involves a high temperature anneal (e.g., at a temperature of from about 700° C. to about 1,300° C.) to improve reliability of the dielectric. The 1,300° C. upper end is preferably performed with some type of millisecond anneal. This high temperature process can however degrade non-high temperature compatible silicide materials, such as nickel silicide (NiSi).

Figure 5:
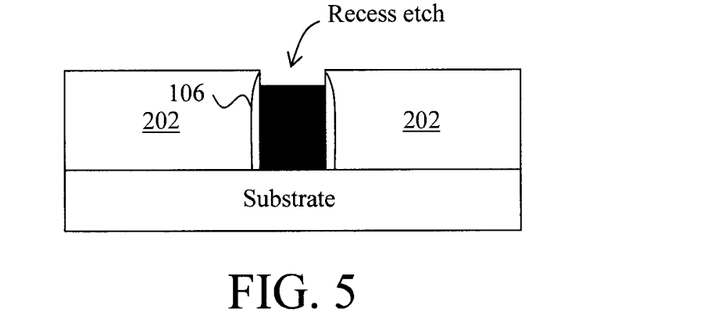
FIG. 5 is a cross-sectional diagram illustrating an etch having been performed to recess the replacement gate below a top surface of the filler material according to an embodiment of the present invention.

Advantageously, the present techniques propose a de-layering of the gap filler material 202 after formation of the replacement gate 402 which enables the formation of low temperature salicide in the source and drain regions of the device. Namely, as shown in FIG. 5, an etch is performed to recess the replacement gate 402 below a top surface of the gap filler material 202. Of course the particular etch chemistry employed may vary depending on the composition of the replacement gate 402 and the gap filler material 202. By way of example only, a metal replacement gate may be etched selective to a dielectric filler material using a wet etching process. The etch can be endpointed, for example, when the replacement gate 402 is recessed from about 5 nanometers (nm) to about 10 nm below the surface of the filler material 202.

Figure 6:
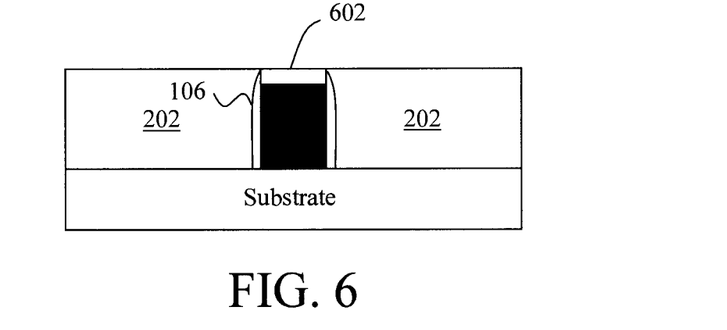
FIG. 6 is a cross-sectional diagram illustrating a gate cap having been formed on the recessed replacement gate according to an embodiment of the present invention.

Next, as shown in FIG. 6, a gate cap 602 is formed on the recessed replacement gate 402. According to an exemplary embodiment, the gate cap 602 is formed by first depositing a suitable capping material (e.g., a nitride material, such as silicon nitride) onto the gap filler material 202 and filling the recesses in the gap filler material 202 over the replacement gate 402. Excess deposited material can then be removed by planarization (using for example chemical mechanical polishing (CMP)) down to the surface of the gap filler material 202. The gate cap 602 (in conjunction with spacers 106) will protect the replacement gate 402 during the subsequent processing steps. Specifically, the spacers 106 in combination with the gate cap 602 completely encapsulate the replacement gate 402.

Figure 7:
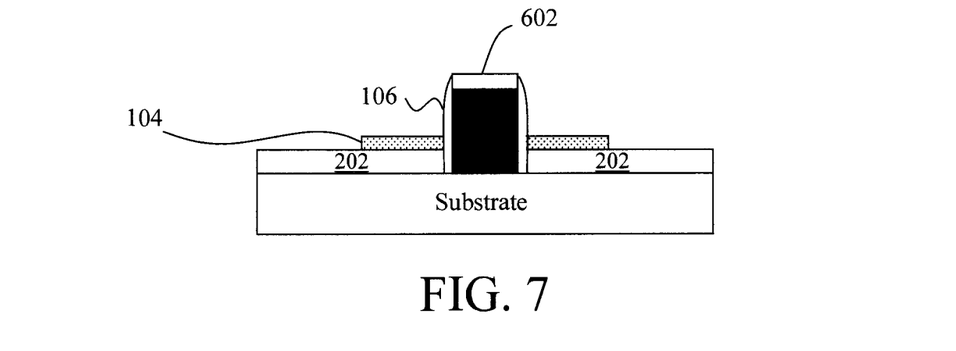
FIG. 7 is a cross-sectional diagram illustrating de-layering of the filler material having been performed to expose the source and drain regions of the device according to an embodiment of the present invention.

Namely, as shown in FIG. 7, de-layering of the gap filler material 202 is then performed. According to an exemplary embodiment, this de-layering is performed by etching-back the gap filler material 202 using a selective etching process. The goal is to remove the gap filler material 202 so as to expose the source and drain regions of the device. By way of example only, an oxide-selective reactive ion etching (RIE) process can be employed to remove a (e.g., silicon dioxide) gap filler material 202 selective to the fins(s) 104. It is not necessary to completely remove the gap filler material 202 once the source and drain regions are exposed, and in some instances it is preferable to endpoint the de-layering etch once the source and drain regions are exposed, but short of removing all of the gap filler material 202. See below. Accordingly, FIG. 7 depicts a portion of the gap filler material 202 remaining after the de-layering etch. It is to be understood however that all of the gap filler material 202 can be removed during this step, if so desired.

Figure 8:
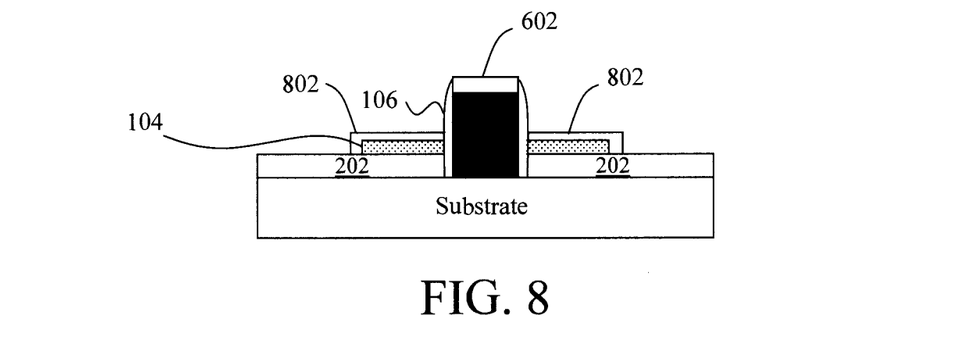
FIG. 8 is a cross-sectional diagram illustrating a salicide having been formed on the exposed source and drain regions of the device according to an embodiment of the present invention.

Finally, as shown in FIG. 8, a salicide 802 is formed on the now exposed source and drain regions of the device. According to an exemplary embodiment, the salicide 802 is formed by first blanket depositing a silicide metal (such as nickel) onto the device structure, and then annealing the device structure (at a temperature of from about 400° C. to about 600° C.) to react the deposited metal with the source and drain region semiconductor forming a silicide. The silicide (a salicide) will form only in the areas of exposed semiconductor (i.e., in the source and drain regions). Any unreacted metal is then removed, e.g., using a wet etching process.

A non-limiting exemplary implementation of the present techniques in the context of a fin first, nanowire last GAA device process flow is now described by way of reference to FIGS. 9-19. An exemplary replacement gate, fin first/nanowire last GAA device process flow is described, for example, in U.S. patent application Ser. No. 13/550,861 filed by Bangsaruntip et al., entitled "Replacement Gate Fin First Wire Last Gate All Around Devices" (hereinafter "Bangsaruntip"), the contents of which are incorporated by reference herein.

In the figures that follow, each of the figures illustrating the fabrication process will show a cross-sectional cut through a portion of the device structure. Thus a legend is provided at the top left corner of each figure illustrating the various orientations of the cuts shown. Specifically there are two orientations of cuts that will be illustrated throughout the figures. One is a cut along the fin direction. As will be described in detail below fins will be formed which will serve as the channel, source and drain regions of the device. The other is a cut along the gate direction. As will be described in detail below gate stacks will be formed surrounding nanowire channels of the device (gate all around configuration).

Figure 9:
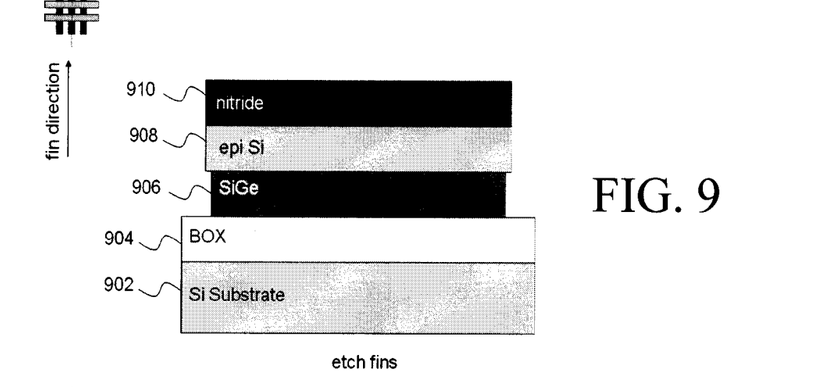
FIG. 9 is a cross-sectional diagram illustrating a starting structure for an exemplary fin first, nanowire last gate-all-around device process flow including a series of Si and SiGe (sacrificial) layers formed in a stack on an SOI wafer, and one or more fins patterned in the stack according to an embodiment of the present invention.

As shown in FIG. 9, the starting platform for the process is a semiconductor-on-insulator (SOI) wafer having a Si substrate 902 and a Si-containing SOI layer 906 separated from the Si substrate 902 by a buried oxide or BOX 904.

In this exemplary embodiment, it is desirable to have the SOI layer 906 contain SiGe. As described in Bangsaruntip, a SiGe SOI wafer may be produced by forming a SiGe layer on a commercially available SOI wafer and then condensing the SiGe to form a single SiGe SOI layer (such as SiGe SOI layer 906 in FIG. 9. As will become apparent in the description of the following process, SiGe SOI layer 906 will serve as a sacrificial layer, which will be removed in order to release the Si nanowires from the fin stack (see below).

As shown in FIG. 9, an epitaxial Si layer 908 is grown over the SiGe SOI layer 906. Optionally, one or more additional sacrificial layers and/or crystalline Si layers may be epitaxially grown in an alternating fashion as a stack on top of the wafer, in which the properties of the additional sacrificial layer(s) are the same as SiGe SOI layer 906, and the properties of the additional crystalline Si layer(s) are the same as Si layer 908.

Fin hardmasks 910 are present on the Si layer 908 and are used to pattern fins in the stack of layers. According to the exemplary embodiment shown illustrated in FIG. 9, the fin hardmasks are formed from a nitride material. The fins formed in the Si layers, once released from the sacrificial layers as described below, will be the nanowire channels, source and drain regions of the device. According to an exemplary embodiment, a Si-selective RIE is used to remove portions of the Si/sacrificial layers not masked by the fin hardmasks using the BOX as an etch stop. The nanowire hardmasks may also be removed at this stage using, for example, a nitride-selective RIE. It is notable, as shown in FIG. 9, that the SiGe SOI layer 906 is thinner following the fin etch than the Si layer 908. This is the result of the SiGe being etched laterally during the fin etch.

Since the fin etch is being performed at this point in the process, i.e., before the dummy gate/replacement gate steps, this process is also referred to herein as a fin first process. Further, since the nanowire channels formed in the fins will be released from the sacrificial layer after the dummy gate steps, this process is also referred to herein as a wire last process.

Reference to the legend at the top left corner of FIG. 9 shows the orientation of the cross-sectional cut depicted in FIG. 9. Specifically, the orientation of the cross-sectional cut shown in FIG. 9 is along the fin direction, through one of the fins.

Figure 10:
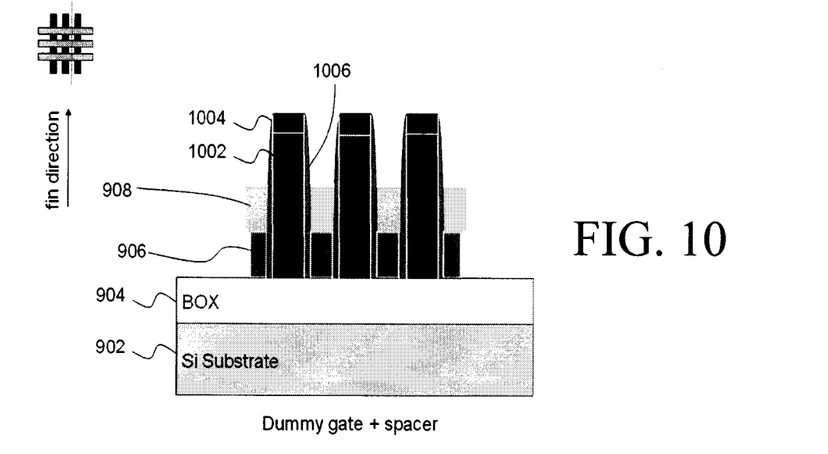
FIG. 10 is a cross-sectional diagram illustrating dummy gates having been formed surrounding the fins, and spacers having been formed on opposite sides of the dummy gates according to an embodiment of the present invention.

Next, as shown in FIG. 10, dummy gates 1002 are then formed surrounding the fins. To form the dummy gates 1002, a dummy gate material (e.g., poly-silicon) is first blanket deposited onto the wafer covering the fins, and then patterned using gate hardmasks 1004 (e.g., nitride hardmasks). Dummy gates 1002 are formed over what will be the channel regions of the device.

Spacers 1006 are then formed on opposite sides of the dummy gates 1002. Spacers 1006 serve to offset the gate a certain distance from the source/drain regions. According to an exemplary embodiment, the spacers 1006 are formed from a nitride material, such as silicon nitride.

Reference to the legend at the top left corner of FIG. 10 shows the orientation of the cross-sectional cut depicted in FIG. 10. Specifically, the orientation of the cross-sectional cut shown in FIG. 10 is along the fin direction. It is notable that in the depiction in FIG. 10, the cross-sectional cut along the fin direction is between two of the fins.

Figure 11:
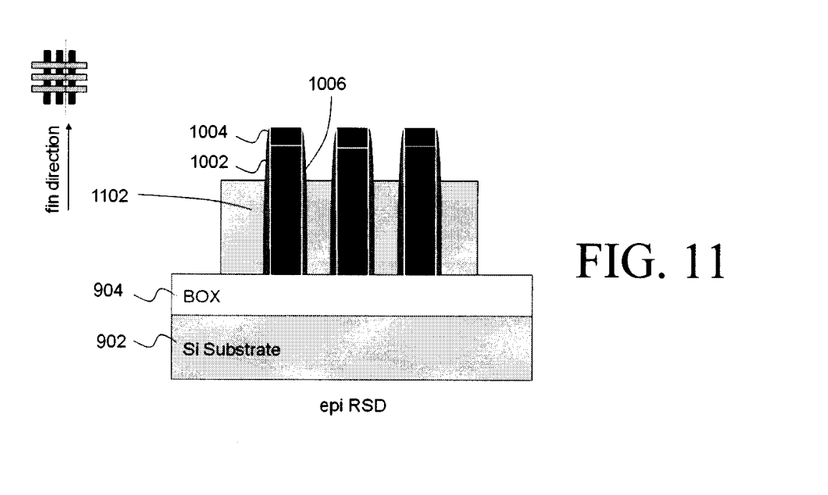
FIG. 11 is a cross-sectional diagram illustrating an optional epitaxy having been used to form raised source and drain regions on exposed portions of the fins which will serve as source and drain regions of the device according to an embodiment of the present invention.

Optionally, as shown in FIG. 11, an epitaxy step may be used to form raised source and drain regions (RSD) 1102 on the exposed portions of the fins which will serve as source and drain regions of the device (i.e., the channel regions of the fins are already covered by the dummy gates 1002). Epitaxy to form the raised source and drain regions 1102 may be carried out using VPE, MBE or LPE with a gaseous or liquid precursor, such as silicon tetrachloride.

Reference to the legend at the top left corner of FIG. 11 shows the orientation of the cross-sectional cut depicted in FIG. 11. Specifically, the orientation of the cross-sectional cut shown in FIG. 11 is along the fin direction. It is notable that in the depiction in FIG. 11, the cross-sectional cut along the fin direction is between two of the fins.

Figure 12:
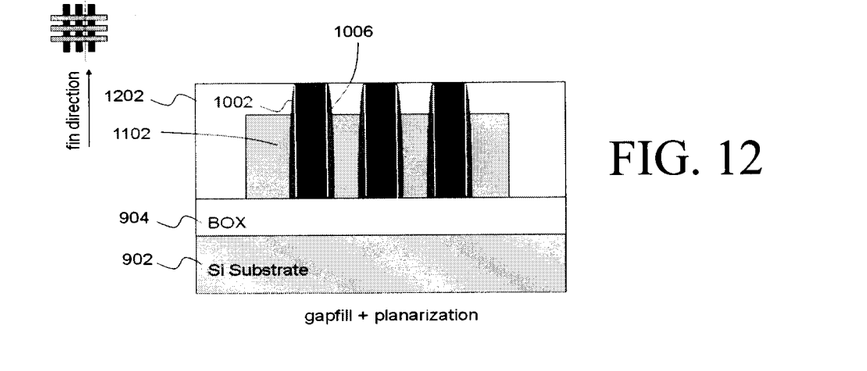
FIG. 12 is a cross-sectional diagram illustrating a gap filler material having been deposited onto the wafer, filling the spaces between the fins and between the dummy gates according to an embodiment of the present invention.

As shown in FIG. 12, a gap filler material 1202 is then deposited onto the wafer, filling the spaces between the fins and between the dummy gates 1002. Gap filler material 1202 can include any suitable filler material, including a dielectric material, such as $SiO_2$. CMP is then used to planarize the filler material, using the dummy gates as an etch stop. As shown in FIG. 12, during this CMP step, any remaining gate hardmasks are also removed.

Reference to the legend at the top left corner of FIG. 12 shows the orientation of the cross-sectional cut depicted in FIG. 12. Specifically, the orientation of the cross-sectional cut shown in FIG. 12 is along the fin direction. It is notable that in the depiction in FIG. 12, the cross-sectional cut along the fin direction is between two of the fins.

Figure 13:
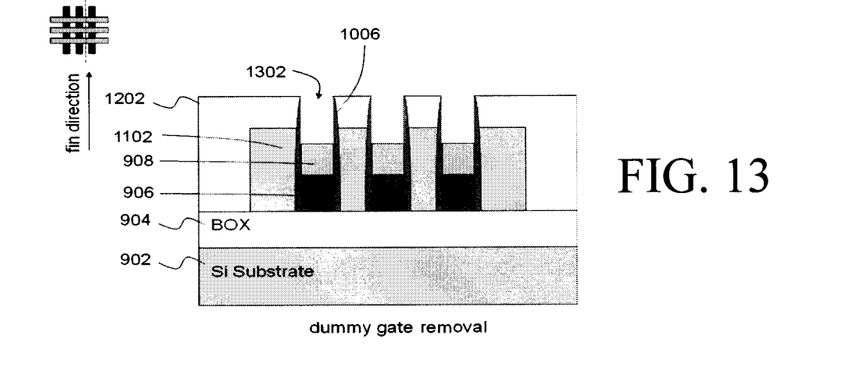
FIG. 13 is a cross-sectional diagram illustrating the dummy gates having been removed selective to the gap filler material forming trenches in the gap filler material according to an embodiment of the present invention.

As shown in FIG. 13, the dummy gates 1002 are then removed selective to the gap filler material 1202. The dummy gates can be removed using a chemical etching process, such as chemical down stream or KOH etching, or RIE. As shown in FIG. 13, removal of dummy gates 1002 results in trenches 1302 being formed in gap filler material 1202. According to an exemplary embodiment, trenches 1302 distinguish (nanowire) channel regions of the device from source and drain regions of the device.

Reference to the legend at the top left corner of FIG. 13 shows the orientation of the cross-sectional cut depicted in FIG. 13. Specifically, the orientation of the cross-sectional cut shown in FIG. 13 is along the fin direction. It is notable that in the depiction in FIG. 13, the cross-sectional cut along the fin direction is between two of the fins.

As provided above, the Si layer 908 will form nanowire channels of the device. In order to be able to form a gate (a replacement gate, see below) that surrounds the nanowire channels, the nanowire channels have to be released from the fin. Namely, the (sacrificial) SiGe SOI layer 906 is removed from the fin, resulting in a suspended nanowire formed from Si layer 908. See FIG. 14. Further, as provided above, more Si and sacrificial layers than what are shown in the figures may be implemented in the same manner as described above, except that in the initial stages of the process, additional Si and sacrificial layers would be formed in the stack (see above). In that case, multiple layers of suspended nanowire channels would be formed in this step. These multiple layers of nanowire channels are commonly referred to as a nanowire "mesh."

Figure 14:
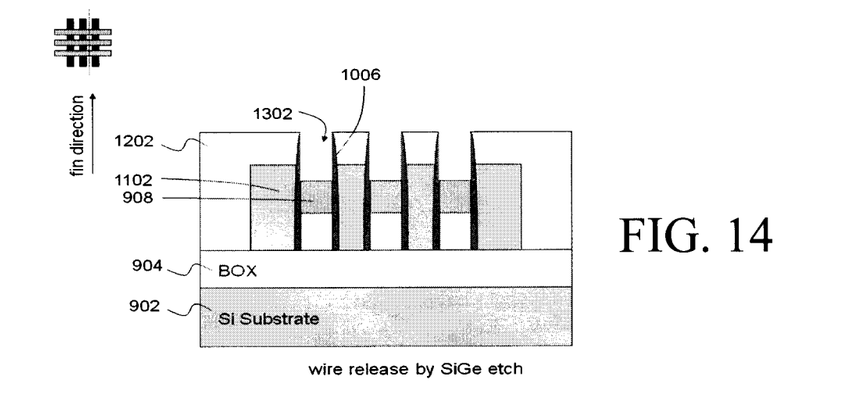
FIG. 14 is a cross-sectional diagram illustrating the (sacrificial) SiGe layer(s) having been removed from the fins, resulting in a suspended nanowire formed from Si layer(s) in the fins according to an embodiment of the present invention.

The sacrificial layers may be removed from the fin stack as follows. A chemical etchant can be employed that exploits the lower oxidation potential of the sacrificial layers as compared to the Si layers. Examples of such etchants include, but are not limited to a 1:2:3 mixture of HF:hydrogen peroxide ($H_2O_2$): acetic acid ($CH_3COOH$), or a mixture of sulfuric acid ($H_2SO_4$) and $H_2O_2$. Alternatively, the sacrificial layers can be selectively removed using a dry etching process such as oxygen ($O_2$) plasma etching or plasma chemistries typically used for etching.

Reference to the legend at the top left corner of FIG. 14 shows the orientation of the cross-sectional cut depicted in FIG. 14. Specifically, the orientation of the cross-sectional cut shown in FIG. 14 is along the fin direction. It is notable that in the depiction in FIG. 14, the cross-sectional cut along the fin direction is between two of the fins.

Figure 15:
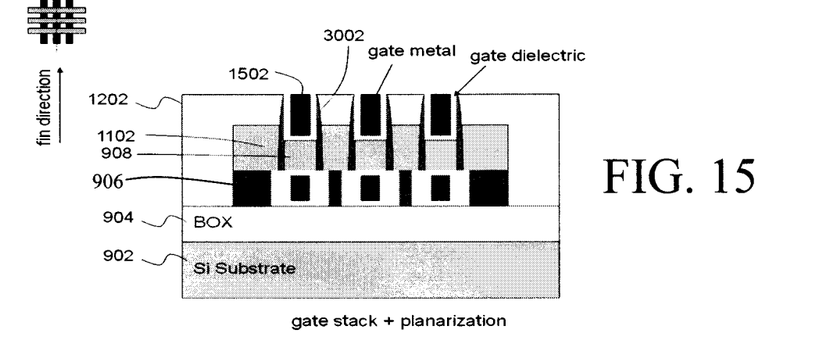
FIG. 15 is a cross-sectional diagram illustrating replacement gates having been formed in the trenches surrounding the nanowire channels according to an embodiment of the present invention.

As shown in FIG. 15, replacement gates 1502 are then formed in the trenches 1302 surrounding the nanowire channels. The replacement gates 1502 are formed by first filling the trenches 1302 with a gate material. Once the gate material is filled into trenches 1302, CMP is used to planarize the gate material. Suitable gate materials include, but are not limited to, one or more of polysilicon, a deposited metal(s) (such as titanium nitride (TiN)) and a hybrid stack of multiple materials such as metal polysilicon). Prior to the formation of the replacements gates 1502, a gate dielectric material is preferably first deposited surrounding the nanowire channels. According to an exemplary embodiment, the gate dielectric material employed is a high-k material, such as hafnium oxide.

Reference to the legend at the top left corner of FIG. 15 shows the orientation of the cross-sectional cut depicted in FIG. 15. Specifically, the orientation of the cross-sectional cut shown in FIG. 15 is along the fin direction. It is notable that in the depiction in FIG. 15, the cross-sectional cut along the fin direction is through one of the fins.

As provided above, for reliability, a high-temperature anneal is performed after the replacement gates 1502 are formed. Accordingly, all of the structures in place prior to the gate anneal have to be high-temperature compatible. As provided above, to address this temperature compatibility requirement, some conventional replacement gate processes employ high-temperature compatible materials to form silicide source and drain contacts. Desirable silicide materials like NiSi, however, cannot be used in this manner. Other solutions include use of a trench silicide process. Misalignment is however a concern with a trench silicidation process.

The above-described process of de-layering/recessing the gap filler material can however be employed in accordance with the present techniques (post-replacement gate formation) to expose the source and drain regions and thereby permit any desired silicide metal to be used to form self-aligned silicide (a salicide) source and drain contacts.

Figure 16:
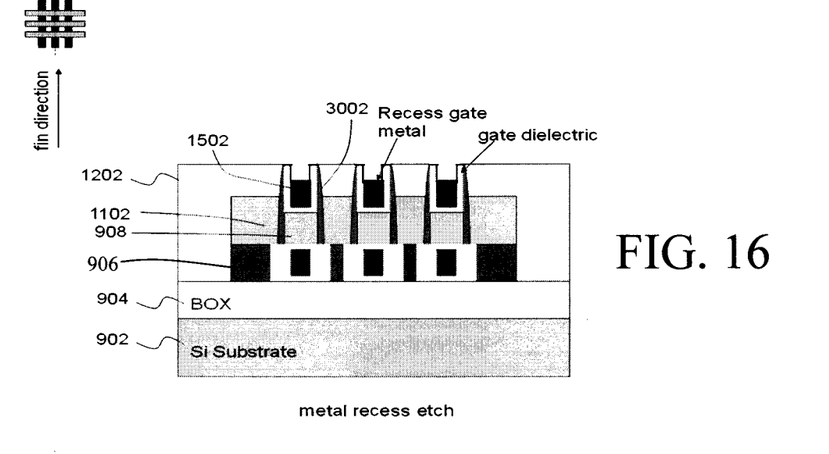
FIG. 16 is a cross-sectional diagram illustrating the replacement gates having been recessed below a top surface of the gap filler material according to an embodiment of the present invention.

Namely, as shown in FIG. 16, the replacement gates 1502 are recessed below a top surface of the gap filler material 1202. The replacement gates 1502 are recessed (selective to the gap filler material 1202) using, e.g., a wet etching process—see above. As provided above, the etch is preferably endpointed when the replacement gates 1502 are recessed from about 5 nm to about 10 nm below the surface of the gap filler material 1202.

Reference to the legend at the top left corner of FIG. 16 shows the orientation of the cross-sectional cut depicted in FIG. 16. Specifically, the orientation of the cross-sectional cut shown in FIG. 16 is along the fin direction. It is notable that in the depiction in FIG. 16, the cross-sectional cut along the fin direction is through one of the fins.

Figure 17:
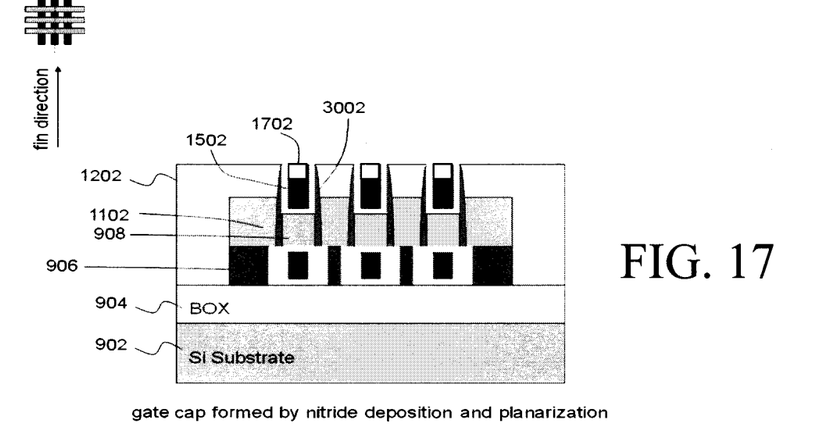
FIG. 17 is a cross-sectional diagram illustrating gate caps having been formed on the recessed replacement gates according to an embodiment of the present invention.

Next, as shown in FIG. 17, gate caps 1702 are formed on the recessed replacement gates 1502. As described above, the gate caps 1702 can be formed by first depositing a suitable capping material (e.g., a nitride material, such as silicon nitride) onto the gap filler material 1202 and filling the recesses in the gap filler material 1202 over the replacement gates 1502. Excess deposited material can then be removed by planarization (using for example CMP) down to the surface of the gap filler material 1202. The gate caps 1702 in conjunction with spacers 3002 encapsulate the replacement gates 1502 and thus will protect the replacement gates 1502 during subsequent processing steps.

Reference to the legend at the top left corner of FIG. 17 shows the orientation of the cross-sectional cut depicted in FIG. 17. Specifically, the orientation of the cross-sectional cut shown in FIG. 17 is along the fin direction. It is notable that in the depiction in FIG. 17, the cross-sectional cut along the fin direction is through one of the fins.

Figure 18:
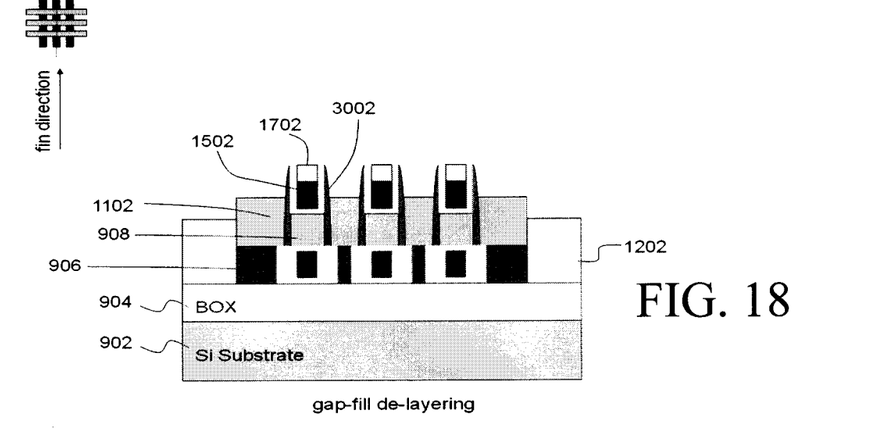
FIG. 18 is a cross-sectional diagram illustrating de-layering of the gap filler material having been performed to expose the (raised) source and drain regions of the device according to an embodiment of the present invention.

Next, as shown in FIG. 18, de-layering of the gap filler material 1202 is then performed to expose the raised source and drain regions. According to an exemplary embodiment, this de-layering is performed by etching-back the gap filler material 1202 using a selective etching process. By way of example only, an oxide-selective RIE can be used to remove an oxide gap filler material 1202 selective to the Si nanowires.

As shown in FIG. 18, it is not necessary to completely remove the gap filler material 1202 once the source and drain regions are exposed. In this case, the remaining gap filler material 1202 will leave exposed only those areas of the device (i.e., the source and drain regions) for which silicidation is desired—thus permitting self-aligned salicide formation.

Reference to the legend at the top left corner of FIG. 18 shows the orientation of the cross-sectional cut depicted in FIG. 18. Specifically, the orientation of the cross-sectional cut shown in FIG. 18 is along the fin direction. It is notable that in the depiction in FIG. 18, the cross-sectional cut along the fin direction is through one of the fins.

Figure 19:
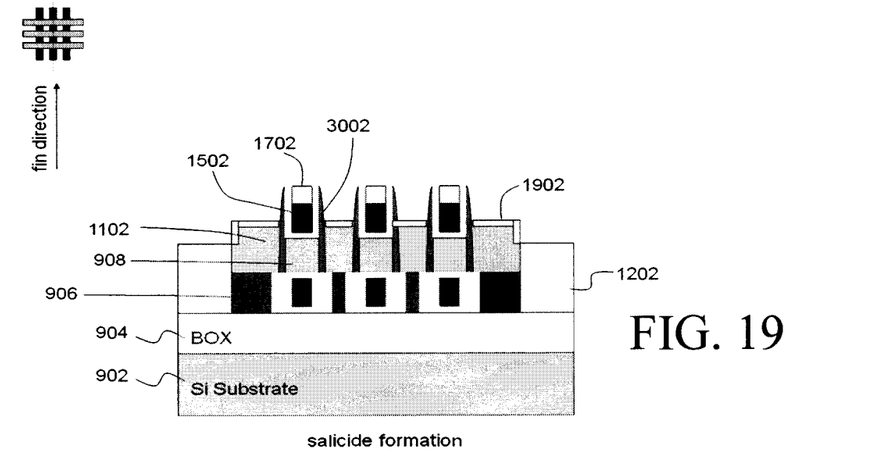
FIG. 19 is a cross-sectional diagram illustrating a salicide having been formed on the exposed source and drain regions of the device according to an embodiment of the present invention.

Finally, as shown in FIG. 19, a salicide 1902 is formed on the now exposed source and drain regions of the device. According to an exemplary embodiment, the salicide 1902 is formed by first blanket depositing a silicide metal (such as nickel) onto the device structure, and then annealing the device structure (at a temperature of from about 400° C. to about 600° C.) to react the deposited metal with the source and drain region semiconductor forming a silicide. The silicide (a salicide) will form only in the areas of exposed semiconductor (i.e., in the source and drain regions). Any unreacted metal is then removed, e.g., using a wet etching process.

Reference to the legend at the top left corner of FIG. 19 shows the orientation of the cross-sectional cut depicted in FIG. 19. Specifically, the orientation of the cross-sectional cut shown in FIG. 19 is along the fin direction. It is notable that in the depiction in FIG. 19, the cross-sectional cut along the fin direction is through one of the fins.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a field-effect transistor (FET) device, the method comprising the steps of:
    forming at least one dummy gate over an active area of a wafer, wherein the dummy gate is formed over a portion of the active area which serves as a channel region of the device, wherein portions of the active area extending out from under the dummy gate serve as source and drain regions of the device, wherein the active area of the wafer comprises one or more fins, wherein each of the fins comprises at least one silicon layer and at least one sacrificial layer in a stack on the wafer, and wherein the dummy gate is formed surrounding the fins;
    forming spacers on opposite sides of the dummy gate;
    depositing a gap filler material around the dummy gate;
    removing the dummy gate selective to the gap filler material, forming a trench in the gap filler material;
    following removal of the dummy gate, removing the sacrificial layer from each of the fins, thus releasing the silicon layer from each of the fins resulting in the silicon layer forming a suspended nanowire;
    forming a replacement gate in the trench in the gap filler material;
    annealing the replacement gate at a temperature of from about 700° C. to about 1,300° C.;
    recessing the replacement gate below a surface of the gap filler material forming a recess in the gap filler material above the replacement gate;
    forming a gate cap in the recess above the replacement gate;
    etching back the gap filler material to expose at least a portion of the source and drain regions of the device; and
    forming a salicide on the source and drain regions of the device.

2. The method of claim 1, wherein the replacement gate is recessed from about 5 nm to about 10 nm below the surface of the gap filler material.

3. The method of claim 1, wherein the replacement gate is recessed below the surface of the gap filler material using a wet etching process.

4. The method of claim 1, wherein the step of forming the gate cap in the recess above the replacement gate comprises the steps of:
    depositing a nitride material onto the gap filler material filling the recess above the replacement gate; and
    planarizing the nitride material down to the surface of the gap filler material using chemical mechanical polishing to form the gate cap.

5. The method of claim 1, wherein the gap filler material is etched back only enough to expose a portion of the source and drain regions of the device, such that a portion of the gap filler material remains.

6. The method of claim 1, wherein the gap filler material comprises an oxide, and wherein the gap filler material is etched back using an oxide-selective reactive ion etching process.

7. The method of claim 1 wherein the step of forming the salicide on the source and drain regions of the device comprises the steps of:
    blanket depositing a silicide metal onto the wafer;
    annealing the wafer to react the silicide metal with the source and drain regions of the device; and
    removing any unreacted metal.

8. The method of claim 1, wherein the silicide metal comprises nickel.

9. The method of claim 1, further comprising the step of:
    using epitaxy to form raised source and drain regions of the device.

10. The method of claim 1, wherein the gate cap in combination with the spacers encapsulate the replacement gate.

11. A method of fabricating a FET device, the method comprising the steps of:
    forming at least one dummy gate over an active area of a wafer, wherein the dummy gate is formed over a portion of the active area which serves as a channel region of the device, and wherein portions of the active area extending out from under the dummy gate serve as source and drain regions of the device;
    forming spacers on opposite sides of the dummy gate;
    depositing a gap filler material around the dummy gate;
    removing the dummy gate selective to the gap filler material, forming a trench in the gap filler material;
    forming a replacement gate in the trench in the gap filler material;
    annealing the replacement gate at a temperature of from about 700° C. to about 1,300° C.;
    recessing the replacement gate below a surface of the gap filler material forming a recess in the gap filler material above the replacement gate;
    forming a gate cap in the recess above the replacement gate;
    etching back the gap filler material to expose at least a portion of the source and drain regions of the device, wherein the gap filler material is etched back only enough to expose a portion of the source and drain regions of the device, such that a portion of the gap filler material remains; and
    forming a salicide on the source and drain regions of the device.

* * * * *